(12) United States Patent
Lin

(10) Patent No.: US 9,154,144 B2
(45) Date of Patent: Oct. 6, 2015

(54) STACKED CMOS PHASE-LOCKED LOOP

(71) Applicant: TAIWAN SEMICONDUCTOR MANUFACTURING CO., LTD., Hsin-Chu (TW)

(72) Inventor: Yu-Tso Lin, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/572,823

(22) Filed: Dec. 17, 2014

(65) Prior Publication Data

US 2015/0171873 A1 Jun. 18, 2015

Related U.S. Application Data

(60) Provisional application No. 61/917,377, filed on Dec. 18, 2013.

(51) Int. Cl.
| | |
|---|---|
| *H03L 7/06* | (2006.01) |
| *H03L 7/093* | (2006.01) |
| *H03L 7/085* | (2006.01) |
| *H02M 3/07* | (2006.01) |

(52) U.S. Cl.
CPC ............... *H03L 7/093* (2013.01); *H02M 3/07* (2013.01); *H03L 7/085* (2013.01)

(58) Field of Classification Search
USPC .................................. 327/147–149, 156–158
See application file for complete search history.

(56) References Cited

U.S. PATENT DOCUMENTS

| | | | | |
|---|---|---|---|---|
| 5,550,783 A | * | 8/1996 | Stephens et al. | 365/233.13 |
| 2009/0219069 A1 | * | 9/2009 | Shinozaki et al. | 327/158 |
| 2011/0133796 A1 | * | 6/2011 | Osada | 327/156 |
| 2012/0293223 A1 | * | 11/2012 | Watanabe | 327/157 |
| 2014/0043014 A1 | * | 2/2014 | Ho et al. | 324/76.19 |

OTHER PUBLICATIONS

Shin, J., "A 1.9-3.8 GHz sigma-delta Fractional-N PLL Frequency Synthesizer With Fast Auto-Calibration of Loop Bandwidth and VCO Frequency", IEEE Journal of Solid-State Circuits, Mar. 2012, 47(3):665-675.

* cited by examiner

*Primary Examiner* — Adam Houston
(74) *Attorney, Agent, or Firm* — Duane Morris LLP

(57) ABSTRACT

A phase-locked loop includes a first semiconductor layer and a second semiconductor layer spaced apart from the first semiconductor layer. The first semiconductor layer has formed thereon a phase frequency detector circuit having a reference frequency input, a feedback frequency input, an up output and a down output, a charge pump circuit having a first input coupled to the up output and a second input coupled to the down output, and an output, and a loop filter circuit coupled to the charge pump. The second semiconductor layer has formed thereon a voltage controlled oscillator having an input and an output, and a feedback frequency divider circuit having an input coupled to the output of the voltage controlled oscillator and an input. A first interlayer via couples the loop filter circuit to the input of the voltage controlled oscillator circuit. A second interlayer via couples the output of the feedback frequency divider circuit to the feedback input of the phase frequency detector.

20 Claims, 5 Drawing Sheets

STACKED CMOS PHASE-LOCKED LOOP

RELATED APPLICATION

This application claims the priority benefit of U.S. Provisional Application No. 61/917,377, filed Dec. 18, 2013, entitled STACKED CMOS PHASE-LOCKED LOOP, the entirety of which is hereby incorporated by reference.

BACKGROUND

This disclosure relates generally to the field of phase-locked loops, and more particularly to a stacked CMOS phase-locked loop.

A phase-locked loop (PLL) is a system that generates an output signal whose phase is related to the phase of an input signal. PLLs include a phase frequency detector (PFD), a charge pump, a low-pass filter, a voltage controlled oscillator (VCO), and a feedback path from the VCO to the phase frequency detector. Phase-locked loops typically include divider circuits, which divide the input signal and the feedback signal to the phase frequency detector.

The phase frequency detector and the low-pass filter are analog circuits, while the VCO and the dividers are high speed circuits. The VCO and dividers typically produce large amounts of interference and noise on power and signal lines, and through substrate coupling, in the PLL. The analog circuits tend to be very sensitive to noise.

The frequency response of the VCO with respect to frequency is known as KVCO. KVCO is determined by the size of the capacitors in the low-pass filter, wherein larger capacitors result in larger KVCOs. There are advantages and disadvantages associated with a large KVCO. The advantages include larger VCO frequency range and higher tolerance to supply voltage and temperature variations. The disadvantages include the need for larger chip die sizes to accommodate the larger capacitors, and greater VCO noise. The disadvantages tend to outweigh the advantages.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features can be arbitrarily increased or reduced for clarity of discussion.

DETAILED DESCRIPTION

Figure 1:
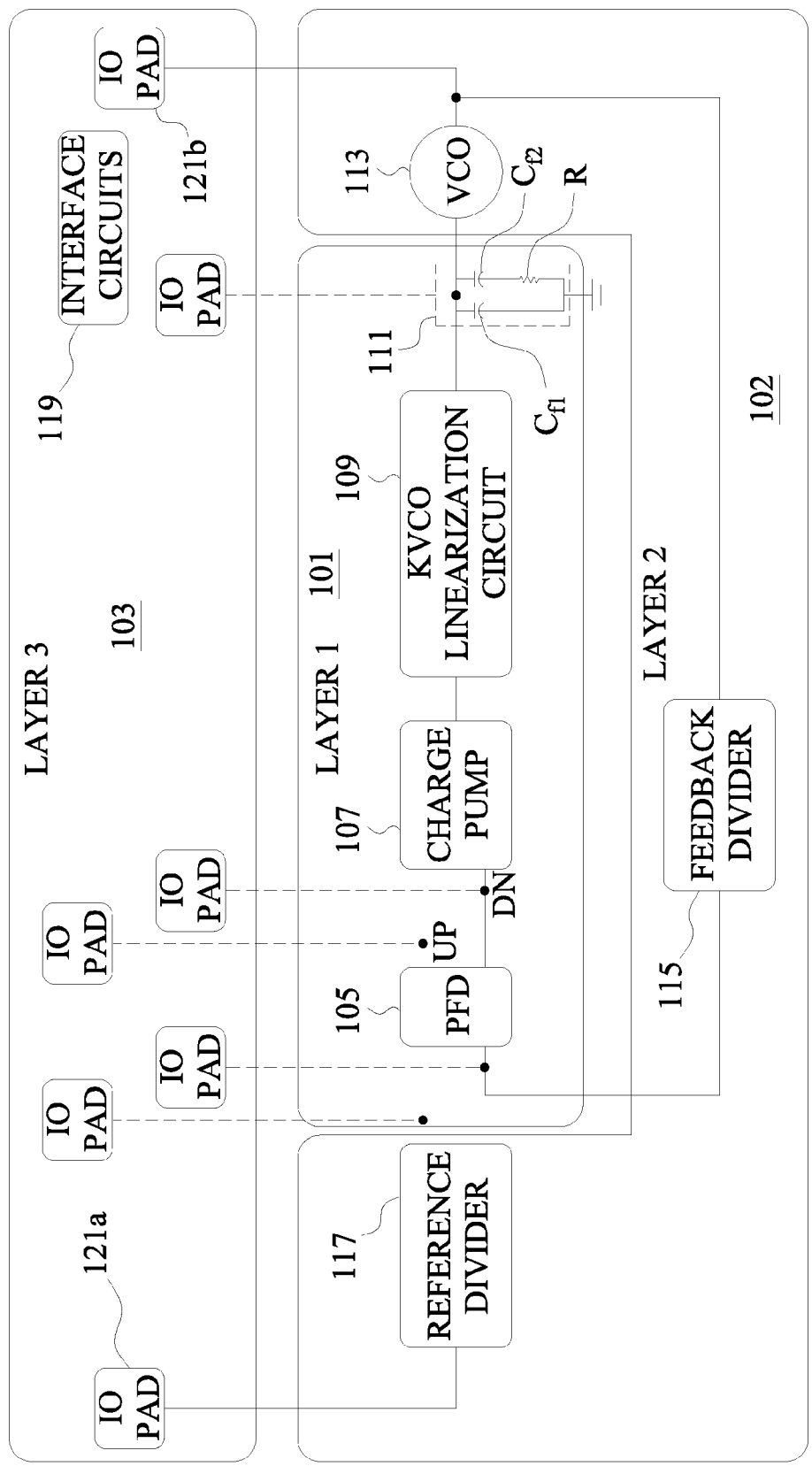
FIG. 1 is a block diagram of a stacked CMOS phase-locked loop in accordance with various embodiments of the present disclosure.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning coupling and the like, such as "connected" and "interconnected," refer to a relationship wherein devices or nodes are in direct or indirect electrical communication, unless expressly described otherwise.

It is understood that the following disclosure provides many different embodiments or examples for implementing different features of various embodiments. Specific examples of components and arrangements are described below to simplify the present disclosure. These are, of course, merely examples and are not intended to be limiting. The present disclosure may repeat reference numerals and/or letters in the various examples. This repetition is for the purpose of simplicity and clarity and does not in itself dictate a relationship between the various embodiments and/or configurations discussed.

Referring now to the drawings, and first to FIG. 1, a phase-locked loop according to an embodiment of the present disclosure includes a first semiconductor layer 101, a second semiconductor layer 102, and a third semiconductor layer 103. In FIG. 1, the semiconductor layers 101-103 are depicted in one plane for ease of description and understanding. However, as described with respect to FIGS. 2A-2D, phase-locked loops according to various embodiments are implemented in a stacked CMOS three-dimensional structure wherein the semiconductor layers are stacked vertically, one on top of another.

First layer 101 includes a plurality of analog circuits, including a phase frequency detector (PFD) 105, a charge pump 107, a linearization circuit 109, and a loop filter 111. Second layer 102 includes a plurality of high-speed, noise producing circuits, including a voltage controlled oscillator (VCO) 113, a feedback divider 115, and a reference divider 117. Third layer 103 includes various interface circuits 119 (e.g., clock buffers) and a plurality of input/output (IO) pads 121, including an input pad 121a and an output pad 121b. By placing the various circuits on different layers 101, 102, and 103, respectively, such stacked CMOS structure reduces interference as well as noise, substrate, power and ground couplings from VCO 113 and/or feedback divider 115 to other circuits.

PFD 105 includes two inputs. PFD 105 compares a reference frequency signal received at input pad 121a and coupled through reference divider 117 to a feedback frequency signal produced by VCO 113 and coupled through feedback divider

115. PFD 105 produces an UP error signal or a DN error signal based upon the phase difference of the reference frequency signal and the feedback frequency signal. The magnitude of the UP or DN error signal is proportional to the magnitude of the phase difference between the reference frequency signal and the feedback frequency signal. The UP and DN error signals are coupled to charge pump 107. Charge pump 107 is coupled to a loop filter 111.

Loop filter 111 is a passive second-order filter, which includes a first capacitor $C_{f1}$, a resistor R, and a low pass filter comprising a second capacitor $C_{f2}$ and a resistor R. Loop filter 111 receives an input current from charge pump 107 and outputs a voltage to VCO 113. First capacitor $C_{f1}$ reduces discrete voltage steps at the input of VCO 113 due to instantaneous changes in the output of charge pump 107. The low pass filter comprising a second capacitor $C_{f2}$ and a resistor R rejects reference sidebands, sometimes known as spurs. Loop filter 111 determines phase-locked loop stability, which is how the phase-locked loop responds to disturbances, such as changes in the reference frequency or changes in feedback divider 115. Loop filter 111 also limits the amount of reference frequency energy or ripple appearing at the output of PFD 105 that is then applied the input of VCO 113.

The gain or frequency response of VCO 113 to varying input voltage is known a KVCO. KVCO is equal to the derivative of frequency with respect to voltage (KVCO=dFreq/dVC). The values of capacitor $C_{f1}$ of loop filter 111 is related to KVCO by the equation $w_n=(KVCO*I_{CP}/M*C_{f1})^{1/2}$, where $w_n$ is the natural frequency of the PLL, $I_{CP}$ is the current of charge pump 107, and M is ratio of feedback divider 115. In order to maintain constant $w_n$, $I_{CP}$ and M, a larger KVCO indicates a larger $C_{f1}$ and a smaller KVCO indicates a smaller $C_{f1}$. A larger $C_{f1}$ increases cost and chip area. Also, a large value of KVCO also results a great amount of noise produced by the VCO. According to various embodiments of the present disclosure, and as described in detail below, linearization circuit 109 linearizes the voltage provided by loop filter 111 to VCO 113, thereby reducing the magnitude of KVCO.

The output frequency signal produced by VCO 113 is coupled to output pad 121b. The output frequency signal of VCO 113 is also coupled to the feedback input of PFD 105 through feedback divider 115. Feedback divider 115 divides VCO frequency by a constant M and thereby increases the VCO frequency to M times that of the input reference. Reference divider 117 divides the input frequency received at input pad 121a by a constant N.

Figure 2A:
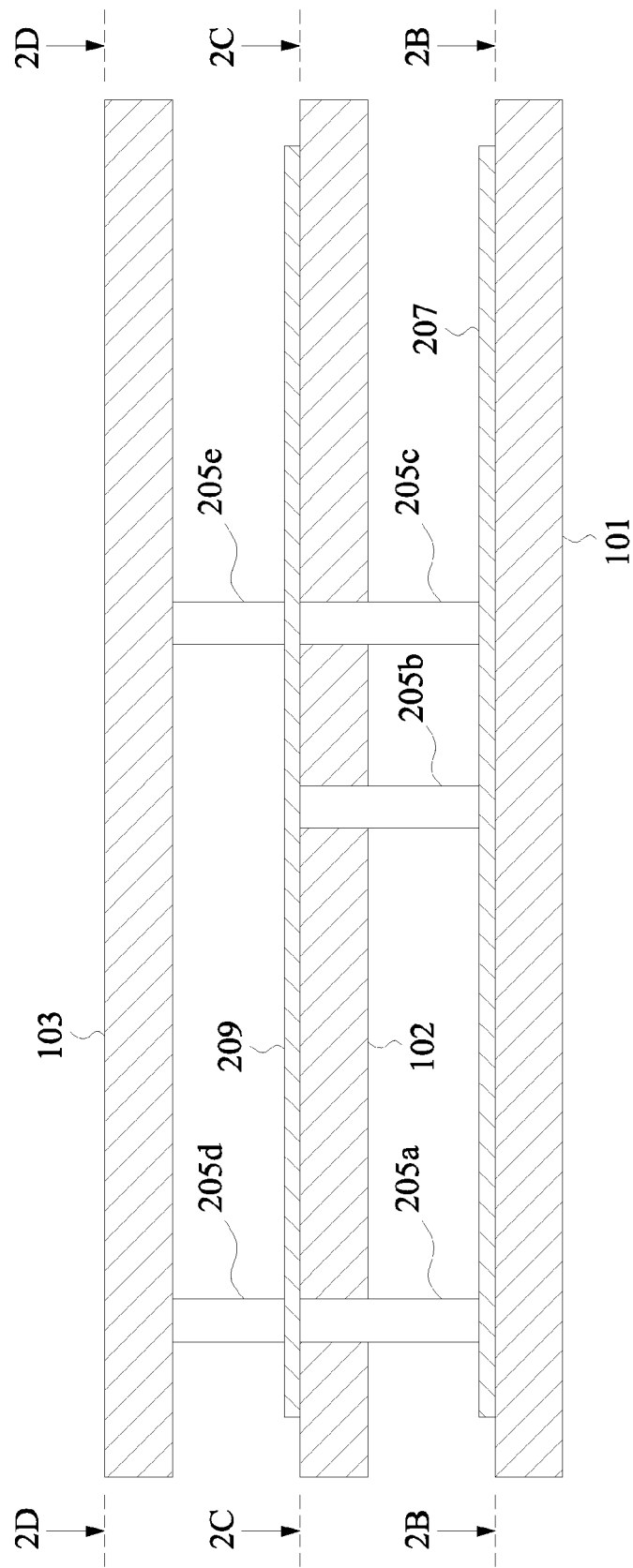
FIG. 2A is a side section view of a stacked CMOS phase-locked loop in accordance with various embodiments of the present disclosure.

Referring now to FIG. 2A, an embodiment of a phase-locked loop includes vertically stacked semiconductor layers 101-103. Semiconductor layers 101-303 are interconnected by interlayer vias 205a-205e. In some embodiments, the phase-locked loop is included in a monolithic 3D IC fabricated on a single semiconductor substrate 101, and the interlayer vias 205a-205e connect devices in respectively different layers (also referred to as tiers) of the 3D IC. First semiconductor layer 101 is shielded by a shielding layer 207, described in detail below. Similarly, second semiconductor layer 102 is shielded by a shielding layer 209.

Figure 2B:
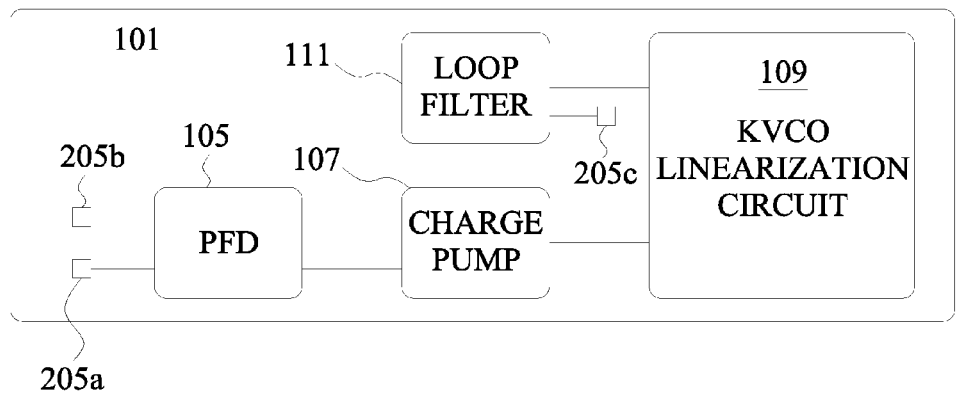
FIG. 2B is a layout view of a first layer of a stacked CMOS phase-locked loop in accordance with various embodiments of the present disclosure.

As shown in FIG. 2B, which is a view taken along lines 2B-2B of FIG. 2A, first semiconductor layer 101 includes PFD 105. The feedback frequency input of PFD 105 is coupled to interlayer via 205a and the reference frequency input of PFD 105 is coupled to interlayer via 205b. The UP and DN outputs of PFD 105 are coupled to charge pump 107. The output of charge pump 107 is coupled to the input of KVCO linearization circuit 109. The output of KVCO linearization circuit 109 is coupled to the input of loop filter 111. The output of loop filter 111 is coupled to interlayer via 205c. In some embodiments, the top metal (conductive line) layer corresponding to the first semiconductor layer 101 provides ground shielding.

Figure 2C:
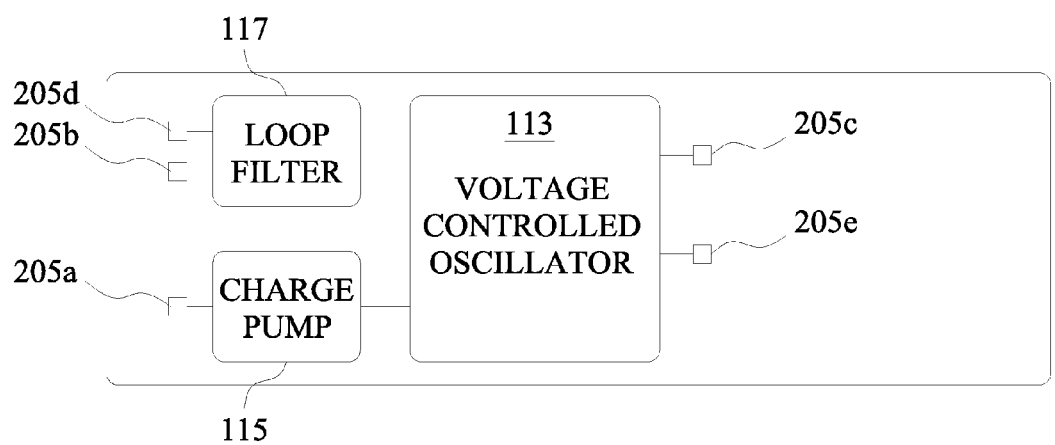
FIG. 2C is a layout view of a second layer of a stacked CMOS phase-locked in accordance with various embodiments of the present disclosure.
Figure 2D:
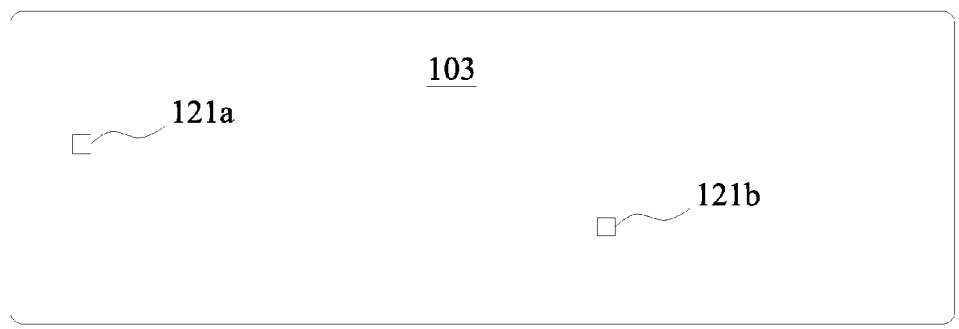
FIG. 2D is a layout view of a third layer of a stacked CMOS phase-locked loop in accordance with various embodiments of the present disclosure.

As shown in FIG. 2C, which is a view taken along lines 2C-2C of FIG. 2A, second semiconductor layer 102 includes a reference divider 117, the input of which is coupled to interlayer via 205d to receive the input frequency signal from input pad 121a of third semiconductor layer 103. The output of reference divider 117 is coupled to interlayer via 205b thereby to couple reference frequency signal to PFD 105 of first semiconductor layer 101. The input of voltage controlled oscillator 113 is coupled to interlayer via 205c, thereby to receive the signal from loop filter 111 of first semiconductor layer 101. The output of voltage controlled oscillator 113 is coupled to interlayer via 205e, thereby to provide the output frequency signal to output pad 121b of third semiconductor layer 103. The output frequency signal of voltage controlled oscillator 113 is also coupled to the input of feedback divider 115. The output of feedback divider 115 is coupled to interlayer via 205a, thereby to provide the feedback frequency signal to PFD 105. In some embodiments, the top metal (conductive line) layer corresponding to the second semiconductor layer 102 provides ground shielding. FIG. 2D is a layout view of third semiconductor layer 103 of the stacked CMOS layers taken along lines 2D-2D of FIG. 2A.

Figure 3:
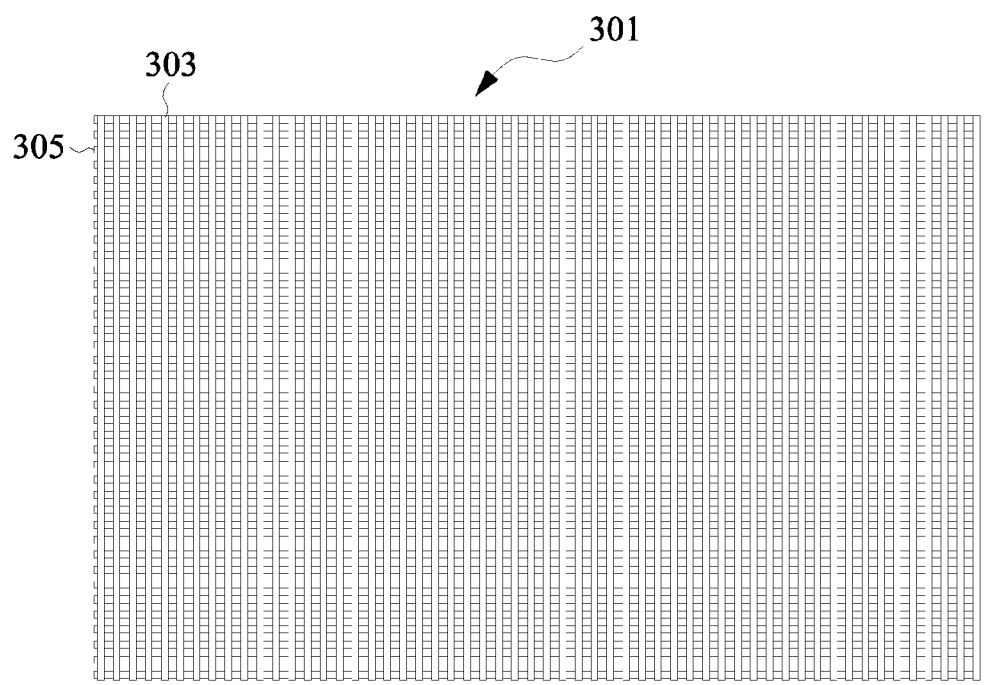
FIG. 3 is a top view of a shielding layer in accordance with various embodiments of the present disclosure.

Referring now to FIG. 3, there is shown an example of a shielding layer 301 according to some embodiments of the present disclosure. Shielding layer 301 comprises a plurality of substantially parallel first metal strips (or conductive lines) 303 and a plurality of substantially parallel second metal strips (or conductive lines) 305 substantially orthogonal to first metal strips 303. In some embodiments, metal strips 303 and 305 of each associated semiconductor layer are formed in the same metal layer. In other embodiments, metal strips 303 and 305 for each associated semiconductor layer are in different metal layers from each other.

Figure 4:
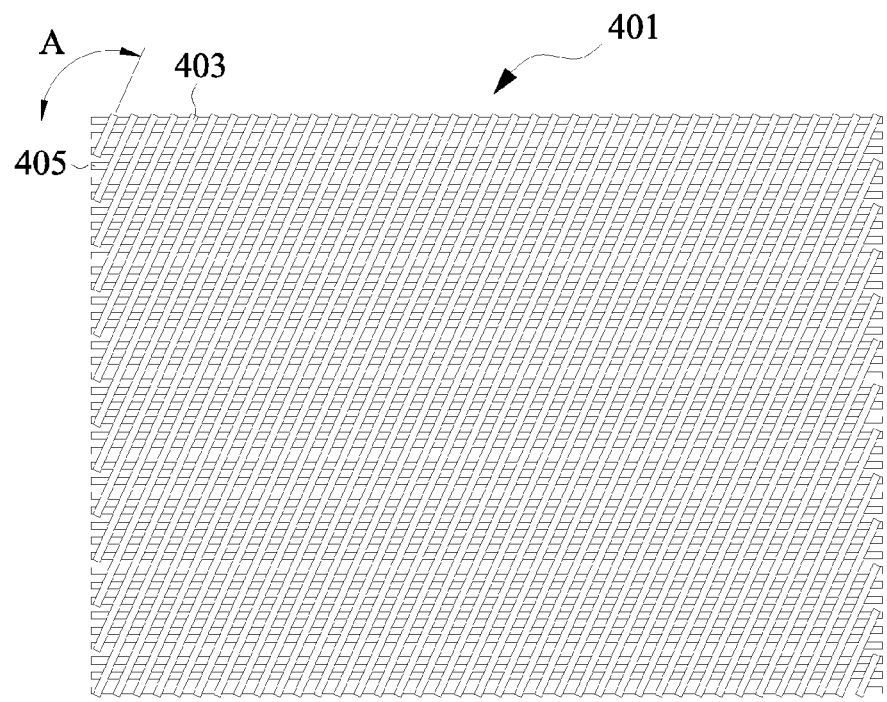
FIG. 4 is a top view of a shielding layer in accordance with various other embodiments of the present disclosure.

FIG. 4 shows an example of a shielding layer 401 according to other embodiments of the present disclosure. Shielding layer 401 comprises a plurality of substantially parallel first metal strips 403 and a plurality of substantially parallel second metal strips 405 non-orthogonal to first metal strips 403. For example, the second metal strips 405 can be oriented at an angle A (for non-limiting examples, from about 75 degrees to about 105 degrees) away from the first metal strips 403 to further suppress unwanted signal noises. Metal strips 403 and 405 can be in the same or different metal layers of their associated semiconductor layer.

Figure 5:
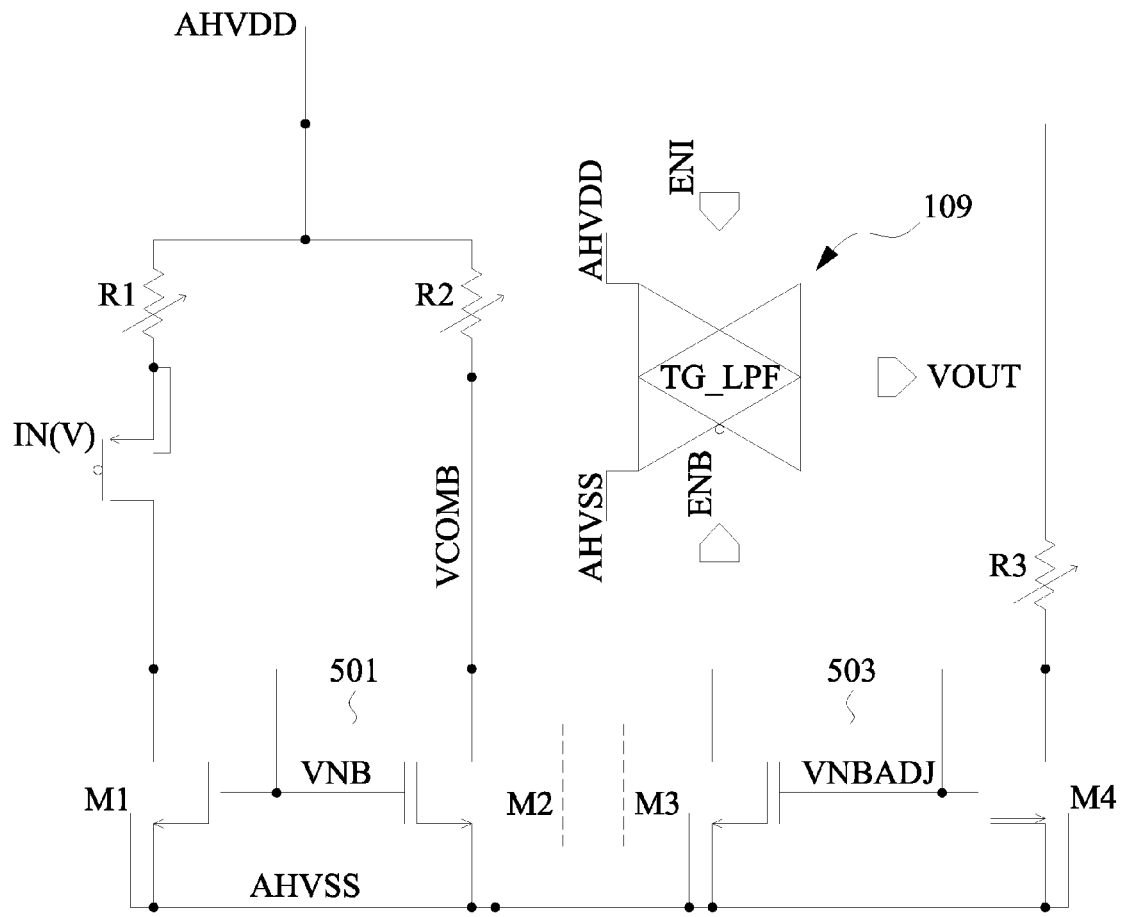
FIG. 5 is a schematic view of a linearization circuit in accordance with various embodiments of the present disclosure.
Figure 6:
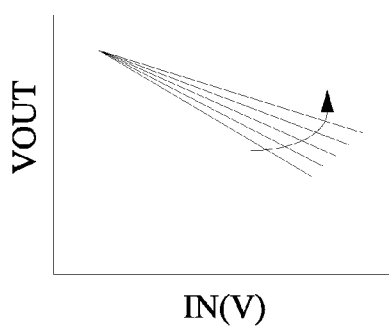
FIG. 6 is a first plot illustrating linearization circuit input voltage versus linearization output voltage in accordance with various embodiments of the present disclosure.
Figure 7:
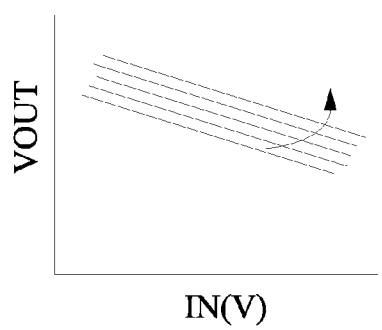
FIG. 7 is a second plot illustrating linearization circuit input voltage versus linearization output voltage in accordance with various embodiments of the present disclosure.

FIG. 5 shows an example of a linearization circuit 109 on layer 101 in the stacked CMOS phase-locked loop structure according to various embodiments of the present disclosure. Linearization circuit 109 includes transistors M1 and M2, which form a first current mirror 501, and transistors M3 and M4, which form a second current mirror 503. Voltage AHVDD is controlled by variable resistors R1, R2 and R3, which in turn are controlled by digital circuits (not shown). Transmission gate TG_LPF forms an output switch. The adjustment of sizes of transistors M1 and M2 in current mirror 501 and variable resistors R1 and R2 can change voltage VCOMB to thereby reduce the slope of VOUT versus IN(V) as shown by the direction of the arrow in FIG. 6 (VCOMB outputs to VOUT via transmission gate TG_LPF). The adjustment of sizes of transistors M3 and M4 in current mirror 503 and variable resistors R2 and R3 can change dc portion of voltage VCOMB and IN(V) without affecting the slope of VOUT versus IN(V) as shown in FIG. 7. As discussed above, linearization circuit 109 linearizes the voltage (VOUT) provided by loop filter 111 to VCO 113, thereby reducing the magnitude of KVCO. Reducing the magnitude of KVCO reduces the size of the capacitors in loop filter 111, which decreases cost and chip area. Additionally, a smaller value of KVCO results in a smaller amount of noise produced by VCO 113 in the stacked CMOS phase-locked loop structure.

As can be seen from the foregoing, the stacked CMOS phase-locked loop structure according to embodiments of the present disclosure reduces the coupling of interference and noise produced by VCO 113 and dividers 115 and 117 to PFD 105, charge pump 107, linearization circuit 109, and loop filter 111 by placing VCO 113 and dividers 115 and 117 on one layer and PFD 105, charge pump 107, linearization circuit 109 and loop filter 107 on a separate layer. Placing VCO 113 on a separate layer from the other circuits reduces interference, noise, substrate, power and ground coupling from VCO 113 to PFD 105, charge pump 107, linearization circuit 109 and loop filter 107 Metal shielding layers 301 and 401 further reduce unwanted signal coupling and noise between layers 101-103. Linearization circuit 109 according to various embodiments of the present disclosure reduces the KVCO of VCO 113, thereby reducing the sizes of capacitors $C_{f1}$ and $C_{f2}$ of loop filter 111, which leads to lower chip area and cost, as well as lower noise coupling among the circuits. The lower KVCO enabled by linearization circuit 109 leads to lower VCO 113 control voltage variation and less noise produced by VCO 113.

In some embodiments, a phase-locked loop, comprises: a first semiconductor layer having formed thereon; a phase frequency detector circuit having a reference frequency input, a feedback frequency input, an up output and a down output, a charge pump circuit having a first input coupled to the up output and a second input coupled to the down output, and an output, and a loop filter circuit coupled to the charge pump; a second semiconductor layer spaced apart from the first conductor layer and having formed thereon a voltage controlled oscillator having an input and an output, and a feedback frequency divider circuit having an input coupled to the output of the voltage controlled oscillator and an output; a first inter-layer via coupling the loop filter circuit to the input of the voltage controlled oscillator circuit; and, a second interlayer via coupling the output of the feedback frequency divider circuit to the feedback input of the phase frequency detector.

In some embodiments, a phase-locked loop, comprises: a first semiconductor layer having formed thereon; a phase frequency detector circuit having a reference frequency input, a feedback frequency input, an up output and a down output, a charge pump circuit having a first input coupled to the up output and a second input coupled to the down output, and an output, and a loop filter circuit coupled to the charge pump; a second semiconductor layer spaced apart from the first conductor layer and having formed thereon a voltage controlled oscillator having an input and an output; a first interlayer via coupling the loop filter circuit to the input of the voltage controlled oscillator circuit; and, a second interlayer via coupling the output of the voltage controlled oscillator circuit to the feedback input of the phase frequency detector.

In some embodiments, the phase-locked loop includes a linearization circuit formed on the first semiconductor layer and coupled between the output of the charge pump circuit and the loop filter circuit. In some embodiments, the linearization circuit includes: a first current mirror and a second current mirror; and, a variable resistor is coupled to control the first and second current mirrors.

In some embodiments, the phase-locked loop includes a reference frequency divider circuit formed on the second semiconductor layer and having frequency input and a frequency output; and, a third interlayer via coupling frequency output of the reference frequency divider circuit to the reference frequency input of the phase frequency detector.

In some embodiments, the phase-locked loop includes a third semiconductor layer spaced apart from the first and second semiconductor layers and having formed thereon an input pad and an output pad; and, a fourth interlayer via coupling input pad to the reference frequency input of the reference divider circuit.

In some embodiments, the phase-locked loop includes a fifth interlayer via coupling the output of the voltage controlled oscillator to the output pad.

In some embodiments, the phase-locked loop includes a third semiconductor layer spaced apart from the first and second semiconductor layers and having formed thereon an input pad and an output pad; a third interlayer via coupling the input pad to the reference input of the phase frequency detector circuit; and, a fourth interlayer via coupling the output of the voltage controlled oscillator to the output pad.

In some embodiments, the phase-locked loop includes a shielding layer disposed between the first and second semiconductor layers.

In some embodiments, the phase-locked loop includes a third semiconductor layer spaced apart from the second semiconductor layer and having formed thereon an input pad and a output pad; a third interlayer via coupling the input pad to the reference frequency input of the phase frequency detector circuit; a fourth interlayer via coupling the output pad to the voltage controlled oscillator; and, a second shielding layer disposed between the second and third semiconductor layers.

In some embodiments, the shielding layer comprises: a plurality of substantially parallel first conducting strips extending in a first direction; and, a plurality of substantially parallel second conducting strips extending in a second direction.

In some embodiments, the second direction is orthogonal to the second direction.

In some embodiments, a phase-locked loop comprises: a first semiconductor layer having formed thereon a charge pump having an input and an output; a second semiconductor layer spaced apart from the first conductor layer and having formed thereon a voltage controlled oscillator having an input and an output; a first interlayer via coupling the output of the charge pump to the input of the voltage controlled oscillator; and, a second interlayer via coupling the output of the voltage controlled oscillator to the input of the charge pump.

In some embodiments, the phase-locked loop further comprises a phase frequency detector circuit formed on the first semiconductor layer and coupled to the charge pump, the phase frequency detector circuit having a reference input and a feedback input, wherein the feedback input is coupled to the second interlayer via.

In some embodiments, the phase frequency detector the phase frequency detector is coupled to the charge pump by an up output and a down output.

In some embodiments, the phase-locked loop includes including a linearization circuit and a loop filter, each being formed on the first semiconductor layer, and coupled between the charge pump and the first interlayer via.

In some embodiments, the phase-locked loop includes a third semiconductor layer spaced apart from the first and second semiconductor layers and having formed thereon an input pad and an output pad; a third interlayer via coupling the input pad to the reference frequency input of the phase frequency detector circuit; and, a fourth interlayer via coupling the output of the voltage controlled oscillator to the output pad.

In some embodiments, the phase-locked loop includes a shielding layer disposed between the first and second semiconductor layers.

In some embodiments, a device comprises: a first semiconductor layer having formed thereon a plurality of first circuits, the first circuits including charge pump having an input and an output; a second semiconductor layer having formed thereon a plurality of second circuits, the second circuits including voltage controlled oscillator having an input and an output; and, a plurality of interlayer vias coupling the first semiconductor layer to the second semiconductor layer.

In some embodiments, the first circuits comprise: a phase frequency detector having an output coupled to the input of the charge pump, the phase frequency detector having a feedback input coupled to a first interlayer via; a linearization circuit having an input coupled to output of the charge pump, and having an output; and, a loop filter having input coupled to the output of the linearization circuit, and an output coupled to a second interlayer via.

In some embodiments, the second circuits comprise: a feedback divider having input coupled to the voltage controlled oscillator and an output coupled to the first interlayer via, and wherein the input of the voltage controlled oscillator is couple to the first interlayer via.

The methods and system described herein may be at least partially embodied in the form of computer-implemented processes and apparatus for practicing those processes. The disclosed methods may also be at least partially embodied in the form of tangible, non-transient machine readable storage media encoded with computer program code. The media may include, for example, RAMs, ROMs, CD-ROMs, DVD-ROMs, BD-ROMs, hard disk drives, flash memories, or any other non-transient machine-readable storage medium, wherein, when the computer program code is loaded into and executed by a computer, the computer becomes an apparatus for practicing the method. The methods may also be at least partially embodied in the form of a computer into which computer program code is loaded and/or executed, such that, the computer becomes a special purpose computer for practicing the methods. When implemented on a general-purpose processor, the computer program code segments configure the processor to create specific logic circuits. The methods may alternatively be at least partially embodied in a digital signal processor formed of application specific integrated circuits for performing the methods.

The above-described embodiments are merely possible examples of implementations, merely set forth for a clear understanding of the principles of the disclosure. Many variations and modifications can be made to the above-described embodiments of the disclosure without departing substantially from the spirit and principles of the disclosure. All such modifications and variations are intended to be included herein within the scope of this disclosure and the present disclosure and protected by the following claims.

Further, the foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

While various embodiments of the present subject matter have been described, it is to be understood that the embodiments described are illustrative only and that the appended claims shall be accorded a full range of equivalents, many variations and modifications naturally occurring to those of skill in the art from a perusal hereof.

What is claimed is:

1. A phase-locked loop, which comprises:
    a first semiconductor layer having formed thereon:
        a phase frequency detector circuit having a reference frequency input, a feedback frequency input, an up output and a down output,
        a charge pump circuit having a first input coupled to the up output and a second input coupled to the down output, and an output, and
        a loop filter circuit coupled to the output of the charge pump;
    a second semiconductor layer spaced apart from the first conductor layer and having formed thereon a voltage controlled oscillator having an input and an output, and a feedback divider circuit having an input coupled to the output of the voltage controlled oscillator and an output;
    a first interlayer via coupling the loop filter circuit to the input of the voltage controlled oscillator circuit; and,
    a second interlayer via coupling the output of the feedback divider circuit to the feedback input of the phase frequency detector.

2. The phase-locked loop as claimed in claim 1, including:
    a linearization circuit formed on the first semiconductor layer and coupled between the output of the charge pump circuit and the loop filter circuit.

3. The phase-locked loop as claimed in claim 2, wherein the linearization circuit includes:
    a first current mirror and a second current mirror; and,
    a variable resistor coupled to control the first and second current mirrors.

4. The phase-locked loop as claimed in claim 1, including:
    a reference frequency divider circuit formed on the second semiconductor layer and having a frequency input and a frequency output; and,
    a third interlayer via coupling the frequency output of the reference frequency divider circuit to the reference frequency input of the phase frequency detector circuit.

5. The phase-locked loop as claimed in claim 4, including:
    a third semiconductor layer spaced apart from the first and second semiconductor layers and having formed thereon an input pad and an output pad; and,
    a fourth interlayer via coupling the input pad to the reference frequency input of the reference divider circuit.

6. The phase-locked loop as claimed in claim 5, including:
    a fifth interlayer via coupling the output of the voltage controlled oscillator to the output pad.

7. The phase-locked loop as claimed in claim 1, including:
    a third semiconductor layer spaced apart from the first and second semiconductor layers and having formed thereon an input pad and an output pad;
    a third interlayer via coupling the input pad to the reference input of the phase frequency detector circuit; and,
    a fourth interlayer via coupling the output of the voltage controlled oscillator to the output pad.

8. The phase-locked loop as claimed in claim 1, including:
    a shielding layer disposed between the first and second semiconductor layers.

9. The phase-locked loop as claimed in claim 8, including:
a third semiconductor layer spaced apart from the second semiconductor layer and having formed thereon an input pad and an output pad;
a third interlayer via coupling the input pad to the reference frequency input of the phase frequency detector circuit;
a fourth interlayer via coupling the output pad to the voltage controlled oscillator; and,
a second shielding layer disposed between the second and third semiconductor layers.

10. The phase-locked loop as claimed in claim 8, wherein the shielding layer comprises:
a plurality of substantially parallel first conducting strips extending in a first direction; and,
a plurality of substantially parallel second conducting strips extending in a second direction.

11. The phase-locked loop as claimed in claim 10, wherein the second direction is orthogonal to the second direction.

12. A phase-locked loop, which comprises:
a first semiconductor layer having formed thereon a charge pump having an input and an output;
a second semiconductor layer spaced apart from the first conductor layer and having formed thereon a voltage controlled oscillator having an input and an output;
a first interlayer via coupling the output of the charge pump to the input of the voltage controlled oscillator; and,
a second interlayer via coupling the output of the voltage controlled oscillator to the input of the charge pump.

13. The phase-locked loop as claimed in claim 12, further comprising:
a phase frequency detector circuit formed on the first semiconductor layer and coupled to the charge pump, the phase frequency detector circuit having a reference input and a feedback input, wherein the feedback input is coupled to the second interlayer via.

14. The phase-locked loop as claimed in claim 13, wherein:
the phase frequency detector is coupled to the charge pump by an up output and a down output.

15. The phase-locked loop as claimed in claim 14, including a linearization circuit and a loop filter, each being formed on the first semiconductor layer, and coupled between the charge pump and the first interlayer via.

16. The phase-locked loop as claimed in claim 15, including:
a third semiconductor layer spaced apart from the first and second semiconductor layers and having formed thereon an input pad and an output pad;
a third interlayer via coupling the input pad to the reference frequency input of the phase frequency detector circuit; and,
a fourth interlayer via coupling the output of the voltage controlled oscillator to the output pad.

17. The phase-locked loop as claimed in claim 13, including:
a shielding layer disposed between the first and second semiconductor layers.

18. A device, which comprises:
a first semiconductor layer having formed thereon a plurality of first circuits;
a second semiconductor layer having formed thereon a plurality of second circuits, the second circuits including a voltage controlled oscillator having an input and an output; and,
a plurality of interlayer vias coupling the first semiconductor layer to the second semiconductor layer.

19. The device as claimed in claim 18, wherein the first circuits comprise:
a charge pump having an input and an output;
a phase frequency detector having an output coupled to the input of the charge pump, the phase frequency detector having a feedback input coupled to a first interlayer via;
a linearization circuit having an input coupled to output of the charge pump, and having an output; and,
a loop filter having an input coupled to the output of the linearization circuit, and an output coupled to a second interlayer via.

20. The device as claimed in claim 19, wherein the second circuits comprise:
a feedback divider having an input coupled to the voltage controlled oscillator and an output coupled to the first interlayer via, and wherein:
the input of the voltage controlled oscillator is couple to the first interlayer via.

* * * * *